United States Patent
Dorothy et al.

(10) Patent No.: US 9,998,055 B2
(45) Date of Patent: Jun. 12, 2018

(54) LOW INDUCTANCE POWER ELECTRONICS CONFIGURATION FOR ELECTRIC DRIVE SYSTEMS

(71) Applicant: Caterpillar Inc., Peoria, IL (US)

(72) Inventors: Joshua Wade Dorothy, Dunlap, IL (US); Corey Allen Kauk, Peoria, IL (US)

(73) Assignee: Caterpillar Inc., Deerfield, IL (US)

( * ) Notice: Subject to any disclaimer, the term of this patent is extended or adjusted under 35 U.S.C. 154(b) by 2 days.

(21) Appl. No.: 15/099,298

(22) Filed: Apr. 14, 2016

(65) Prior Publication Data

US 2017/0302210 A1   Oct. 19, 2017

(51) Int. Cl.
| | |
|---|---|
| *H02P 3/18* | (2006.01) |
| *H02P 27/06* | (2006.01) |
| *H01L 25/18* | (2006.01) |
| *H01L 23/488* | (2006.01) |
| *H01L 23/04* | (2006.01) |
| *H02M 7/537* | (2006.01) |
| *H01L 23/36* | (2006.01) |
| *H02M 7/00* | (2006.01) |

(52) U.S. Cl.
CPC .............. *H02P 27/06* (2013.01); *H01L 23/04* (2013.01); *H01L 23/36* (2013.01); *H01L 23/488* (2013.01); *H01L 25/18* (2013.01); *H02M 7/003* (2013.01); *H02M 7/537* (2013.01)

(58) Field of Classification Search
USPC .............. 318/254; 361/274.3, 514, 679.47, 361/679.54, 697, 701, 702, 709
See application file for complete search history.

(56) References Cited

U.S. PATENT DOCUMENTS

| | | | |
|---|---|---|---|
| 5,811,878 A | 9/1998 | Harmoinen et al. | |
| 7,327,024 B2 | 2/2008 | Stevanovic et al. | |
| 7,638,910 B2 | 12/2009 | Akita et al. | |
| 8,604,608 B2 | 12/2013 | Tsuchiya et al. | |
| 8,942,020 B2 | 1/2015 | Shepard | |
| 9,070,665 B2 | 6/2015 | Bergmann | |
| 2010/0328893 A1* | 12/2010 | Higashidani ....... | H05K 7/20927 361/702 |
| 2012/0319542 A1* | 12/2012 | Hazeyama .......... | B60L 11/1803 310/68 D |
| 2013/0271941 A1* | 10/2013 | Guan ................. | H05K 7/18 361/811 |
| 2015/0173238 A1 | 6/2015 | Nakanishi et al. | |
| 2015/0189794 A1* | 7/2015 | Tashima ............... | B62D 5/0406 180/446 |

FOREIGN PATENT DOCUMENTS

CN          201408759 Y       2/2010

* cited by examiner

*Primary Examiner* — Jorge L Carrasquillo

(74) *Attorney, Agent, or Firm* — Miller, Matthias & Hull

(57) ABSTRACT

A multi-stage power module is provided. The multi-stage power module may include at least one heat sink having a first surface, a second surface and an edge, a first set of switches disposed on the first surface of the heat sink, a second set of switches disposed on the second surface of the heat sink, a plurality of capacitors disposed adjacent to the edge of the heat sink, and a bus bar assembly symmetrically coupling the capacitors to each of the first set of switches and the second set of switches.

16 Claims, 4 Drawing Sheets

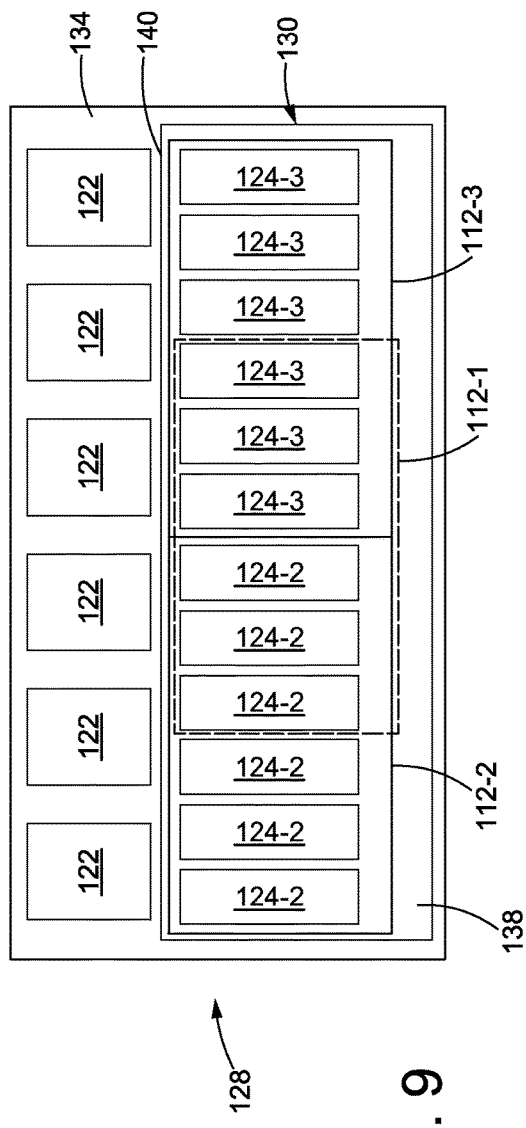
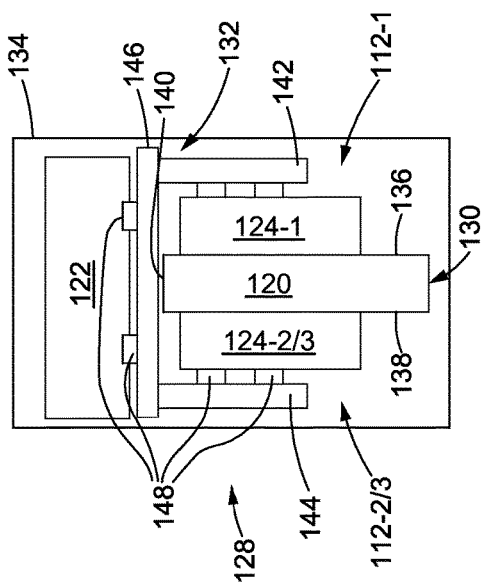
FIG. 9
FIG. 10

LOW INDUCTANCE POWER ELECTRONICS CONFIGURATION FOR ELECTRIC DRIVE SYSTEMS

TECHNICAL FIELD

The present disclosure relates generally to power electronics configurations, and more particularly, to power modules and electric drive systems for switched reluctance machines.

BACKGROUND

Switched reluctance machines are often used as a generator to convert mechanical power received from a primary power source, such as a combustion engine, into electrical power for powering one or more loads of a work machine, or as a motor to convert electrical power within a common bus or energy storage device into mechanical power, such as rotational power for driving wheels, tracks or other traction devices. Switched reluctance motors may also be used as a generator to convert mechanical power received through traction devices, such as during regenerative braking, into electrical power for storage or for use by other loads. Among alternative electric machines, switched reluctance machines have received increased interest for being robust, cost-effective, and generally more efficient. As technology advances, so does the desire to operate switched reluctance machines more efficiently and reliably.

In a typical single-stage or single-machine application, a converter circuit having a series of conductors and switches, such as insulated gate bipolar transistors (IGBTs), is used to engage the individual phases of the connected switched reluctance machine in a manner which either generates electrical energy via the stator thereof, or generates mechanical or rotational energy via the rotor thereof. Multi-stage or multi-machine applications may also be used such as for applications involving higher power or higher load demands. In a multi-stage application, a series of switched reluctance machines can be simultaneously employed by a work machine as generator or motors. However, a multi-stage application would also require as many converter circuits, and even more capacitors and switches, as there are switched reluctance machines. As the number of electrical components increase, the challenges to implementation also increase. Moreover, although conventional power electronics configurations may be adequate for some large scale applications, the scalability of conventional configurations is still limited by physical and performance constraints.

Conventional power modules for multi-stage applications may have one or more capacitors, switches disposed on a heat sink, a bus bar coupling the switches to the capacitors, and a housing encasing the power module. This prior art configuration of a power module can be implemented for use with small scale two-stage systems, large scale two-stage systems, and larger scale three-stage systems. Notably, prior art power modules are designed to use only a single side or surface of the given heat sink. This one-sided configuration causes the size, or at least the length, of the conventional power module to sharply increase for each converter circuit, stage or switched reluctance machine that is added to the system, and thereby makes actual implementation more challenging for larger scale systems due to space limitations.

In addition, conventional power modules may be more susceptible to failures common to the power electronics for switched reluctance machines. In particular, the typical square wave switching patterns applied to the transistors or switches in the power module may cause high rise rates in current. The high rise rate in current, when coupled with the high inductance path typically found in conventional power modules may further cause large voltage overshoot conditions that can damage the transistors or switches. The one-sided or asymmetric nature of conventional power modules, or the uneven and relatively lengthy paths between the capacitors and the switches, also create more unwanted inductance which can expose the switches to more wear and premature failures.

Some converter circuit arrangements may be more compact in design, but are still susceptible to failures due to asymmetric designs. One such configuration is provided, for example, in U.S. Pat. No. 7,327,024 ("Stevanovic"), which employs both layers of a substrate heat sink to take up less space. However, because the capacitors in Stevanovic are not included in the power modules, but rather along the receptacles which receive the power modules, the configurations in Stevanovic are limited in terms of scalability. Furthermore, due to the geometry of the receptacles in Stevanovic, the distances or inductance paths between the capacitors and switches thereof are not substantially reduced or equidistant. Still further, the switches in Stevanovic are also not symmetrically distributed within each power module, but rather alternates with the positions of the diodes on each substrate layer. The alternating switches in Stevanovic, in combination other asymmetries, may introduce unwanted inductance.

In view of the foregoing disadvantages associated with conventional power modules and electronics for large scale electric drive systems, a need therefore exists for more compact, cost-effective and scalable solutions which reduce parasitic inductance and promote the reliability of switches. Accordingly, the present disclosure is directed at addressing one or more of the deficiencies and disadvantages set forth above. However, it should be appreciated that the solution of any particular problem is not a limitation on the scope of this disclosure or of the attached claims except to the extent expressly noted.

SUMMARY OF THE DISCLOSURE

In one aspect of the present disclosure, a power module is provided. The power module may include a heat sink having a first surface and a second surface, at least one switch disposed on each of the first surface and the second surface of the heat sink, at least one capacitor, and a bus bar assembly symmetrically coupling the capacitor to each of the switches.

In another aspect of the present disclosure, a multi-stage power module is provided. The multi-stage power module may include at least one heat sink having a first surface, a second surface and an edge, a first set of switches disposed on the first surface of the heat sink, a second set of switches disposed on the second surface of the heat sink, a plurality of capacitors disposed adjacent to the edge of the heat sink, and a bus bar assembly symmetrically coupling the capacitors to each of the first set of switches and the second set of switches.

In yet another aspect of the present disclosure, an electric drive system is provided. The electric drive system may include a plurality of capacitors forming a direct current (DC) link, and a plurality of converter circuits coupled to the DC link. Each converter circuit may selectively couple the DC link to one of a plurality of switched reluctance machines and including at least one heat sink having a first surface and a second surface, a first set of switches disposed on the first surface, a second set of switches disposed on the second surface, and a bus bar assembly symmetrically coupling each of the first set of switches and the second set of switches to the capacitors.

These and other aspects and features will be more readily understood when reading the following detailed description in conjunction with the accompanying drawings.

BRIEF DESCRIPTION OF THE DRAWINGS

FIG. 9 is a front plan view of one exemplary large scale, three-stage power module of the present disclosure; and FIG. 10 is a side plan view of the large scale, three-stage power module of FIG. 9.

While the following detailed description is given with respect to certain illustrative embodiments, it is to be understood that such embodiments are not to be construed as limiting, but rather the present disclosure is entitled to a scope of protection consistent with all embodiments, modifications, alternative constructions, and equivalents thereto.

DETAILED DESCRIPTION

Figure 2:
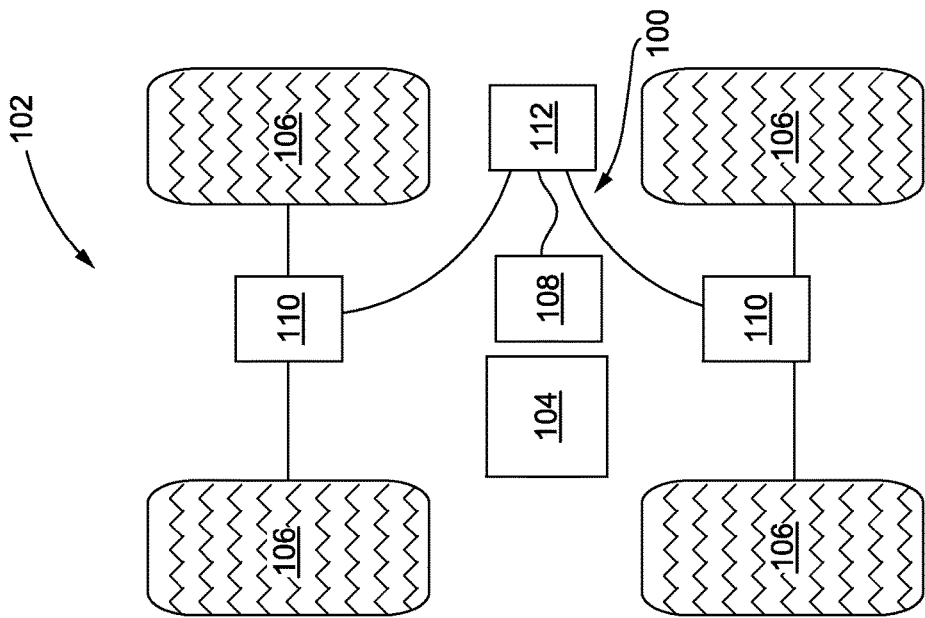
FIG. 2 is a diagrammatic view of another exemplary work machine having a three-stage electric drive system constructed in accordance with the teachings of the present disclosure.
Figure 1:
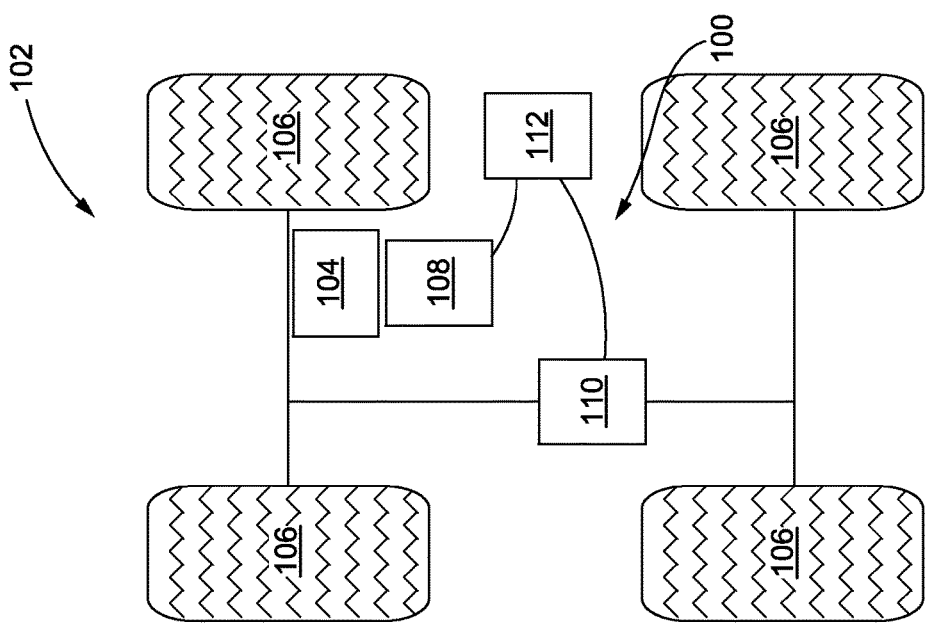
FIG. 1 is a diagrammatic view of one exemplary work machine having a two-stage electric drive system constructed in accordance with the teachings of the present disclosure.

Referring to FIGS. 1 and 2, exemplary embodiments of an electric drive system 100 for a work machine 102 are illustrated. The work machine 102 may be used in mobile applications for performing particular types of operations associated with an industry, such as in mining, construction, farming, transportation, or any other suitable industry. The work machine 102 may include, for example, an earth moving machine, a marine vessel, an aircraft, a tractor, an off-road truck, an on-highway passenger vehicle, or the like. As shown, each work machine 102 may generally include a primary power source 104, such as a diesel engine, a gasoline engine, a natural gas engine, or the like, for powering the electric drive system 100. Each work machine 102 may additionally include one or more traction devices 106, such as wheels, tracks, or any other device capable of causing movement of the work machine 102, which may be powered by the electric drive system 100.

As shown in FIGS. 1 and 2, each electric drive system 100 may incorporate a multi-stage power configuration, for instance, including one or more switched reluctance generators 108, or switched reluctance machines operating as generators, and one or more switched reluctance motors 110, or switched reluctance machines operating as motors. In the particular embodiment of FIG. 1, the electric drive system 100 is provided as a two-stage power configuration having two switched reluctance machines, including one generator 108 and one motor 110. In the embodiment of FIG. 2, the electric drive system 100 is provided as a three-stage power configuration having three switched reluctance machines, including one generator 108 and two motors 110. Each electric drive system 100 may additionally include power electronics, such as an arrangement of converter circuits 112, where each converter circuit 112 is configured to operate a corresponding one of the switched reluctance machines 108, 110.

Figure 3:
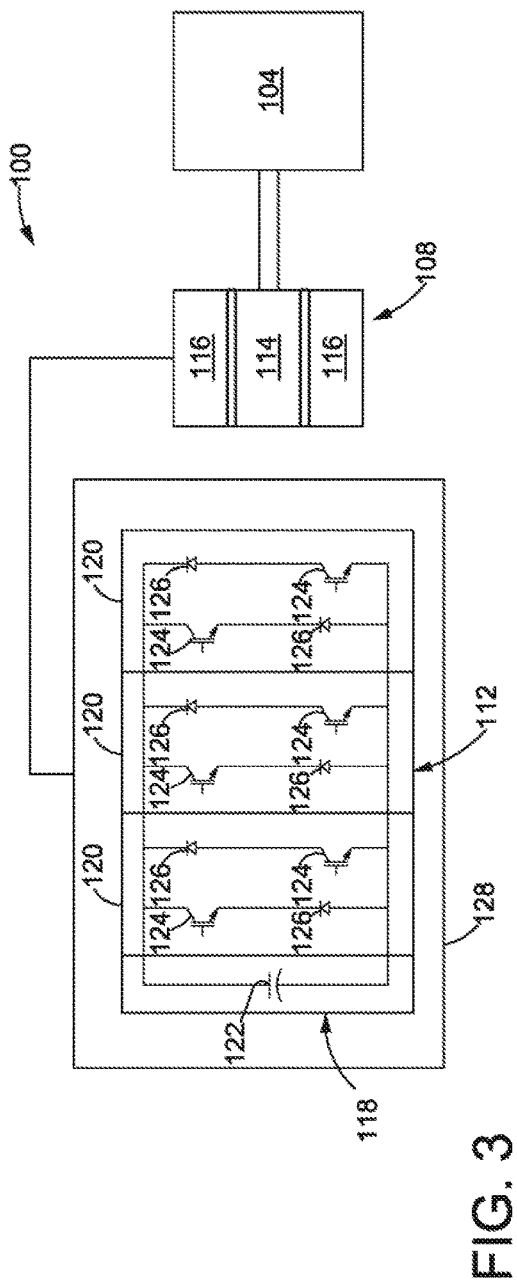
FIG. 3 is a schematic view of one exemplary converter circuit for a switched reluctance generator.
Figure 4:
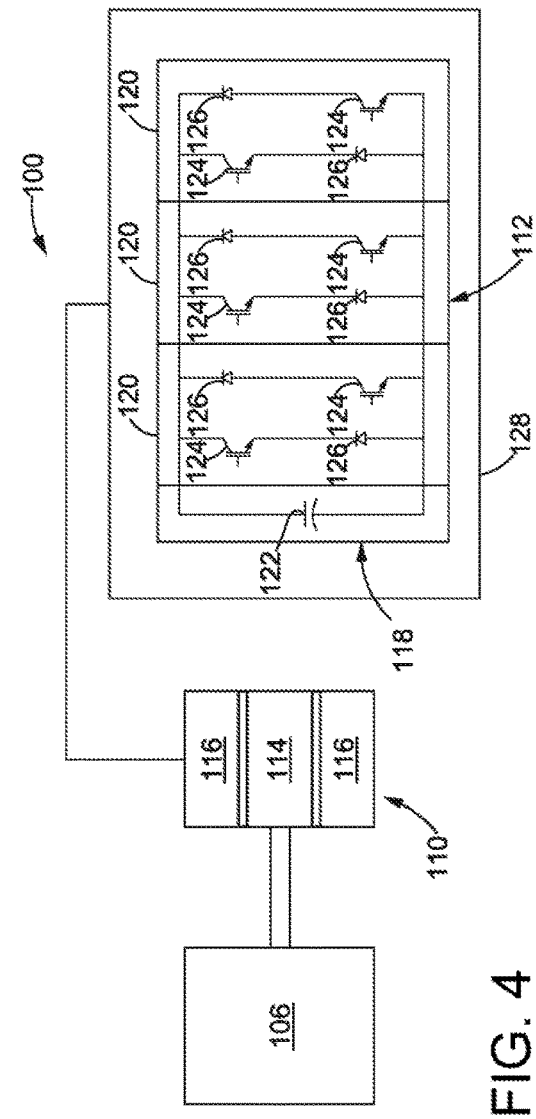
FIG. 4 is a schematic view of one exemplary converter circuit for a switched reluctance motor.

As shown in FIGS. 1 and 2, and as further shown in FIG. 3, each generator 108 may be mechanically driven by the associated power source 104, to generate electrical power. Specifically, the primary power source 104 may mechanically rotate a rotor 114 of the generator 108 and induce electrical power within a stator 116 thereof, such as in the form of three-phase alternating current (AC) power. The AC power induced in the stator 116 may then be communicated to the converter circuit 112 associated with the generator 108, converted into appropriate direct current (DC) power, communicated along a common bus or DC link 118, for instance, to be stored and/or consumed by various loads of the work machine 102. As shown in FIGS. 1 and 2, and as also shown in FIG. 4, converter circuits 112 that are associated with the motors 110 may convert DC power from the DC link 118 into AC power, such as in the form of three-phase AC power, and use the AC power to excite the individual phases 120 of the stator 116 of the corresponding motor 110. The converter circuit 112 thereby causes the rotor 114 to rotate relative to the stator 116 and mechanically engage one or more of the traction devices 106 to move the work machine 102.

Still referring to FIGS. 3 and 4, each converter circuit 112 may include one or more capacitors 122 and a plurality of switches 124. More specifically, the capacitors 122 may be used to form the common bus or DC link 118 from which one or more parallel loads of the work machine 102 may be powered. The switches 124 may include a series of transistors or gated switches, such as insulated gate bipolar transistors (IGBTs), and associated diodes 126 for selectively enabling one or more phases 120, such as phase legs or windings, of the respective stator 116 of the generator 108 and/or motor 110. A three-phase switched reluctance machine, for example, may be provided with two switches 124 and two diodes 126 for selectively enabling or disabling each phase 120. Other power electronics configurations for implementing the electric drive system 100 and/or the converter circuits 112 thereof, as well as other multi-phase and multi-stage applications will be understood by those skilled in the art.

Figure 6:
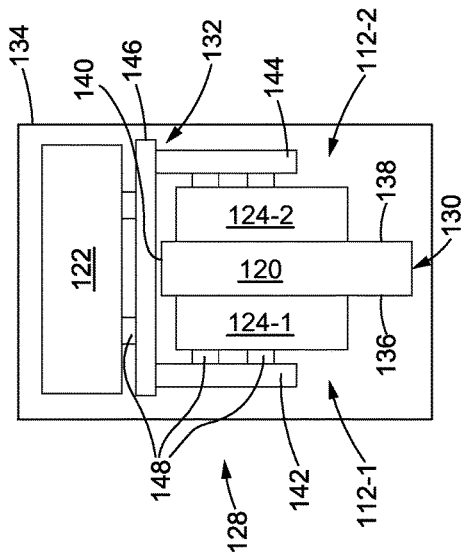
FIG. 6 is a side plan view of the small scale, two-stage power module of FIG. 5.
Figure 5:
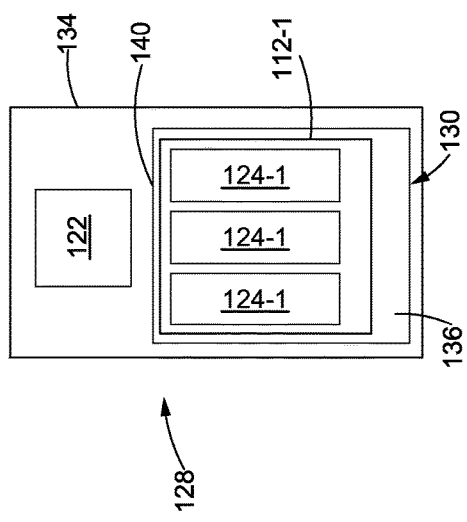
FIG. 5 is a front plan view of one exemplary small scale, two-stage power module of the present disclosure.

Turning now to FIGS. 5 and 6, one exemplary embodiment of a power module 128 that may be used to package one or more converter circuits 112 is provided. For example, the power module 128 may be configured for a two-stage application, having two switched reluctance machines 108, 110 as shown for example in FIG. 1. Furthermore, the power module 128 in FIGS. 5 and 6 may be designed for relatively small scale applications, such as for applications with power or load demands of approximately 200 kW or less. As shown, the power module 128 may generally include capacitors 122, switches 124, one or more heat sinks 130 and a bus bar assembly 132, and a housing 134 for partially or entirely enclosing the capacitors 122, switches 124, heat sinks 130 and bus bar assembly 132. Moreover, the capacitors 122, switches 124, heat sinks 130, bus bar assembly 132 and housing 134 of the power module 128 may be configured with features designed to provide a more compact package and reduce adverse effects of parasitic inductance, while preserving performance and reliability.

As shown in FIGS. 5 and 6, the heat sink 130 may include a first surface 136, a second surface 138 and edges 140 extending therebetween. The power module 128 may also include one or more capacitors 122 disposed adjacent to one of the edges 140 of the heat sink 130. Additionally, each power module 128 may include two converter circuits 112, one for each power stage or switched reluctance machine 108, 110. In the small scale, two-stage application shown, for example, the power module 128 may include a first converter circuit 112-1 for the first stage generator 108, and a second converter circuit 112-2 for the second stage motor 110, where each converter circuit 112 includes three switches 124 disposed on respective surfaces 136, 138 of the heat sink 130. Specifically, the first converter circuit 112-1 for the first stage may include a first set of switches 124-1 disposed on the first surface 136 of the heat sink 130, and the second converter circuit 112-2 for the second stage may include a second set of switches 124-2 disposed on the second surface 138 of the heat sink 130. Furthermore, each of the first set of switches 124-1 may be coupled to a corresponding phase 120 of the generator 108, while each of the second set of switches 124-2 may be coupled to a corresponding phase 120 of the motor 110.

The power module 128 of FIGS. 5 and 6 may further include a bus bar assembly 132 configured to couple the capacitors 122 to each of the first set of switches 124-1 and the second set of switches 124-2. More particularly, the bus bar assembly 132 may include a first bus bar 142 in electrical communication with each of the first set of switches 124-1, a second bus bar 144 in electrical communication with each of the second set of switches 124-2, and a third bus bar 146 electrically coupling the capacitors 122 to each of the first bus bar 142 and the second bus bar 144. Furthermore, the first bus bar 142 may be disposed substantially parallel to the first surface 136 of the heat sink 130, the second bus bar 144 may be disposed substantially parallel to second surface 138 of the heat sink 130, and the third bus bar 146 may be disposed substantially perpendicular to each of the first surface 136 and the second surface 138. Each of the bus bars 142, 144, 146 may also include terminals 148 configured to couple and ensure proper polarity the switches 124, the corresponding bus bars 142, 144, 146 and the capacitors 122.

As shown in FIGS. 5 and 6, and as compared to the prior art power modules, each of the capacitors 122, switches 124, and the bus bar assembly 132 of the power module 128 may be arranged on the heat sink 130 in a manner configured to enable a more compact package that reduces adverse effects of parasitic inductance while preserving performance and reliability. For example, each of the switches 124 may be perpendicularly disposed relative to the bus bar assembly 132 and the capacitors 122 to minimize the distance and thus the inductance path therebetween. Additionally, each of the switches 124 may be configured to be equidistant to the capacitors 122 so as to provide consistent inductance paths therebetween. Furthermore, the bus bar assembly 132 may be symmetrically arranged between both surfaces 136, 138 of the heat sink 130 so as to provide consistent inductance paths even between different power stages or converter circuits 112. By reducing inductance paths as well as consistencies therein, the power module 128 of FIGS. 5 and 6 may reduce the exposure to harmful voltage overshoot conditions.

Figure 8:
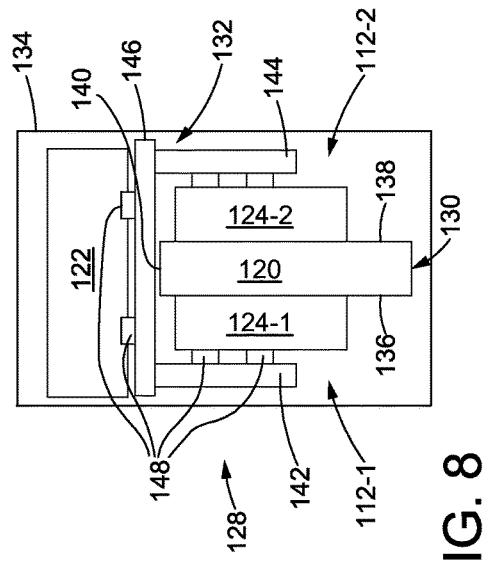
FIG. 8 is a side plan view of the large scale, two-stage power module of FIG. 7.
Figure 7:
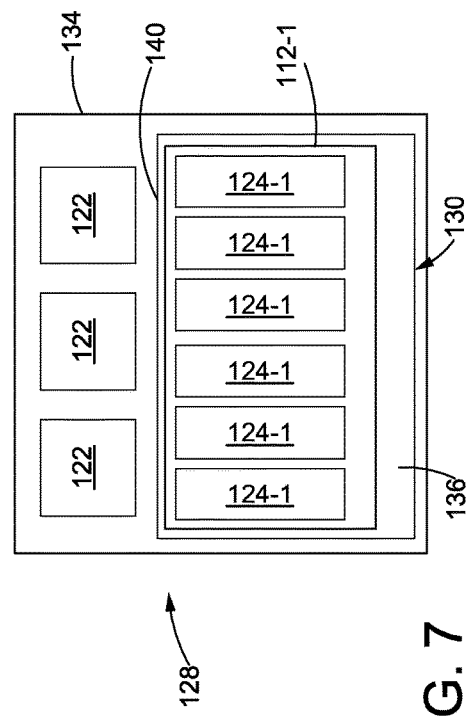
FIG. 7 is a front plan view of one exemplary large scale, two-stage power module of the present disclosure.

Turning to FIGS. 7 and 8, another exemplary embodiment of a power module 128 that may be used to package a plurality of converter circuits 112 is provided. Similar to the embodiment of FIGS. 5 and 6, the power module 128 of FIGS. 7 and 8 may also be configured for a two-stage application, having two switched reluctance machines 108, 110 as shown for example in FIG. 1. Unlike the previous embodiment, however, the power module 128 in FIGS. 7 and 8 may be designed for relatively large scale applications, such as for applications with load demands ranging approximately between 200 kW to 500 kW. As shown, the power module 128 may also include capacitors 122, switches 124, one or more heat sinks 130, a bus bar assembly 132 and a housing 134 arranged with features designed to provide a more compact package and reduce adverse effects of parasitic inductance, while preserving performance and reliability.

Similar to the embodiment of FIGS. 5 and 6, the power module 128 shown in FIGS. 7 and 8 may include a heat sink 130, a plurality of capacitors 122 disposed adjacent to an edge 140 of the heat sink 130, a first converter circuit 112-1 with a first set of switches 124-1 disposed on a first surface 136 of the heat sink 130, and second converter circuit 112-2 with a second set of switches 124-2 disposed on a second surface 138 of the heat sink 130. Moreover, each of the first set of switches 124-1 of the first converter circuit 112-1 may be associated with a corresponding phase 120 of a first switched reluctance machine, or generator 108, while each of the second set of switches 124-2 of the second converter circuit 112-2 may be associated with a corresponding phase 120 of a second switched reluctance machine, or motor 110. In the large scale, two-stage application shown, for example, each converter circuit 112 may include six switches 124, or two switches 124 per phase 120 of the corresponding switched reluctance machine 108, 110, disposed on one of the two surfaces 136, 138 of the heat sink 130.

Again, as in the embodiment of FIGS. 5 and 6, the bus bar assembly 132 of FIGS. 7 and 8 may include a first bus bar 142 in electrical communication with each of the first set of switches 124-1, a second bus bar 144 in electrical communication with each of the second set of switches 124-2, a third bus bar 146 electrically coupling the capacitors 122 to each of the first bus bar 142 and the second bus bar 144, and terminals 148 configured to couple and ensure proper polarity between the switches 124, the corresponding bus bars 142, 144, 146 and the capacitors 122. Furthermore, and as compared to prior art power modules, each of the switches 124 may be perpendicular relative to the bus bar assembly 132 and the capacitors 122, and each of the switches 124 may be equidistant to the capacitors 122 so as to provide consistent and minimized inductance paths therebetween. The bus bar assembly 132 may also be symmetrically arranged between both surfaces 136, 138 of the heat sink 130 so as to provide consistent inductance paths even between different power stages or converter circuits 112.

Referring further to FIGS. 9 and 10, yet another exemplary embodiment of a power module 128 that may be used to package a series of converter circuits 112 is provided. Unlike previous embodiments, the power module 128 of FIGS. 9 and 10 may be configured for a larger three-stage application, having three switched reluctance machines, such as one generator 108 and two motors 110, as shown for example in FIG. 2. The power module 128 in FIGS. 9 and 10 may be applicable to relatively larger scale applications, such as for applications with power or load demands ranging approximately between 500 kW to 1000 kW. As shown, the power module 128 may include a series of capacitors 122, three sets of switches 124, one or more heat sinks 130, a bus bar assembly 132 and a housing 134 arranged with features designed to provide a more compact package and reduce adverse effects of parasitic inductance, while preserving performance and reliability.

More specifically, as shown in FIGS. 9 and 10, the power module 128 may include a heat sink 130, a plurality of capacitors 122 disposed adjacent to an edge 140 of the heat sink 130, a first converter circuit 112-1 having a first set of switches 124-1 disposed on a first surface 136 of the heat sink 130, a second converter circuit 112-2 having a second set of switches 124-2 disposed on a second surface 138 of the heat sink 130, and a third converter circuit 112-3 having a third set of switches 124-3 also disposed on the second surface 138. For example, the first set of switches 124-1 may be associated with a first switched reluctance machine, such as the generator 108 of FIG. 2, the second set of switches 124-2 may be associated with a second switched reluctance machine, such as one of the two motors 110 of FIG. 2, and the third set of switches 124-3 may be associated with a third switched reluctance machine, such as the remaining one of the two motors 110 of FIG. 2. Moreover, in the three-stage application shown, each converter circuit 112 may include six switches 124, or two switches 124 per phase 120.

As in previous embodiments, the bus bar assembly 132 of FIGS. 9 and 10 may provide a first bus bar 142 in electrical communication with each of the first set of switches 124-1, a second bus bar 144 in electrical communication with each of the second and third sets of switches 124-2, 124-3, a third bus bar 146 electrically coupling the capacitors 122 to each of the first bus bar 142 and the second bus bar 144, and terminals 148 configured to couple and ensure proper polarity between the switches 124, the corresponding bus bars 142, 144, 146 and the capacitors 122. Furthermore, and as compared to prior art power modules, each of the switches 124 may be perpendicular relative to the bus bar assembly 132 and the capacitors 122, and each of the switches 124 may be equidistant to the capacitors 122 so as to provide consistent and minimized inductance paths therebetween. The bus bar assembly 132 may also be symmetrically arranged between both surfaces 136, 138 of the heat sink 130 so as to provide consistent inductance paths between the three power stages or converter circuits 112.

Although only certain embodiments are disclosed, other variations and modifications will be apparent to those of ordinary skill in the art. For example, any of the disclosed electric drive systems 100, converter circuits 112 and power modules 128 may be modified, such as scaled down or scaled up, for use with an application not specifically discussed herein. Furthermore, any of the disclosed electric drive systems 100, converter circuits 112 and power modules 128 may be modified for use with applicable electric machines, generators and motors other than switched reluctance machines. Still further, while only two-stage and three-stage power electronics have been disclosed, it will be understood that one-stage or other multi-stage applications may be also constructed consistent with the teachings of the present disclosure.

INDUSTRIAL APPLICABILITY

In general, the present disclosure finds utility in various industrial applications, such as in the construction, mining, farming and other related industries, which may demand or benefit from multi-stage power electronics. More particularly, the present disclosure provides scalable power modules which facilitate the physical implementation of high power electronics for use with a series of switched reluctance machines. Specifically, by utilizing both surfaces of a given heat sink, the present disclosure is capable of significantly reducing the size and length of each power module, which provides reduced costs and space savings. Also, by providing a symmetrical bus bar assembly, and by arranging each of the switches to be perpendicular and equidistant to the corresponding capacitors, the present disclosure significantly reduces the distance of inductance paths within the power electronics and inconsistencies therebetween. By significantly reducing the inductance within the power electronics, the present disclosure is able to protect the switches or transistors from harmful voltage overshoot conditions and premature wear.

From the foregoing, it will be appreciated that while only certain embodiments have been set forth for the purposes of illustration, alternatives and modifications will be apparent from the above description to those skilled in the art. These and other alternatives are considered equivalents and within the spirit and scope of this disclosure and the appended claims.

What is claimed is:
1. A power module, comprising:
a heat sink having a first surface and a second surface;
at least one switch disposed on each of the first surface and the second surface of the heat sink;
at least one capacitor; and
a bus bar assembly symmetrically coupling the capacitor to each of the switches, wherein the bus bar assembly includes a first bus bar, a second bus bar and a third bus bar disposed between the first and second bus bars, the first bus bar in electrical communication with each switch of the first surface, the second bus bar in electrical communication with each switch of the second surface, and the third bus bar electrically coupling the capacitor to each of the first bus bar and the second bus bar, wherein further the first bus bar includes terminals coupled to each switch of the first surface, the second bus bar includes terminals coupled to each switch of the second surface, and the third bus bar includes terminals coupled to the capacitor, the third bus bar being coupled to each of the first bus bar and the second bus bar such that the respective terminals share like polarity.

2. The power module of claim 1, wherein each switch includes an insulated gate bipolar transistor (IGBT) that is perpendicularly disposed relative to the bus bar assembly and equidistant to the capacitor.

3. The power module of claim 1, wherein each of the first surface and the second surface of the heat sink includes at least one switch per phase of an associated switched reluctance machine.

4. The power module of claim 1, wherein the heat sink further includes an edge extending between the first surface and the second surface, the capacitor being disposed adjacent to the edge of the heat sink.

5. The power module of claim 1, wherein the first bus bar is disposed parallel to the first surface of the heat sink, the second bus bar is disposed parallel to the second surface of the heat sink, and the third bus bar is disposed perpendicular to each of the first surface and the second surface of the heat sink.

6. The power module of claim 1, further comprising a housing configured to at least partially enclose each of the heat sink, the switches, the capacitor, and the bus bar assembly.

7. A multi-stage power module, comprising:
a at least one heat sink having a first surface, a second surface and an edge;
a first set of switches disposed on the first surface of the heat sink;
a second set of switches disposed on the second surface of the heat sink;
a plurality of capacitors disposed adjacent to the edge of the heat sink; and
a bus bar assembly symmetrically coupling the capacitors to each of the first set of switches and the second set of switches, wherein the bus bar assembly includes a first bus bar, a second bus bar and a third bus bar disposed between the first and second bus bars, the first bus bar in electrical communication with each switch of the first surface, the second bus bar in electrical communication with each switch of the second surface, and the third bus bar electrically coupling the capacitor to each of the first bus bar and the second bus bar, wherein further the first bus bar includes terminals coupled to each switch of the first surface, the second bus bar includes terminals coupled to each switch of the second surface, and the third bus bar includes terminals coupled to the capacitor, the third bus bar being coupled to each of the first bus bar and the second bus bar such that the respective terminals share like polarity.

8. The multi-stage power module of claim 7, wherein each switch includes an insulated gate bipolar transistor (IGBT) that is perpendicularly disposed relative to the bus bar assembly and equidistant to the capacitors.

9. The multi-stage power module of claim 7, wherein the first set of switches includes at least two switches per phase of a first switched reluctance machine, and the second set of switches includes at least two switches per phase of a second switched reluctance machine.

10. The multi-stage power module of claim 9, wherein the second surface of the heat sink further includes a third set of switches, the third set of switches including at least two switches per phase of a third switched reluctance machine.

11. The multi-stage power module of claim 7, wherein the first bus bar is disposed parallel to the first surface of the heat sink, the second bus bar is disposed parallel to the second surface of the heat sink, the third bus bar is disposed perpendicular to each of the first surface and the second surface of the heat sink.

12. An electric drive system, comprising:
a plurality of capacitors forming a direct current (DC) link; and
a plurality of converter circuits coupled to the DC link, each converter circuit selectively coupling the DC link to one of a plurality of switched reluctance machines and including at least one heat sink having a first surface and a second surface, a first set of switches disposed on the first surface, a second set of switches disposed on the second surface, and a bus bar assembly symmetrically coupling each of the first set of switches and the second set of switches to the capacitors, wherein the bus bar assembly includes a first bus bar, a second bus bar and a third bus bar disposed between the first and second bus bars, the first bus bar in electrical communication with each switch of the first surface, the second bus bar in electrical communication with each switch of the second surface, and the third bus bar electrically coupling the capacitors to each of the first bus bar and the second bus bar, wherein further the first bus bar includes terminals coupled to each switch of the first surface, the second bus bar includes terminals coupled to each switch of the second surface, and the third bus bar includes terminals coupled to the capacitors, the third bus bar being coupled to each of the first bus bar and the second bus bar such that the respective terminals share like polarity.

13. The electric drive system of claim 12, wherein the switches include insulated gate bipolar transistors (IGBTs) that is perpendicularly disposed relative to the bus bar assembly and equidistant to the capacitors.

14. The electric drive system of claim 12, wherein the first set of switches includes at least two switches per phase of a first one of the switched reluctance machines, and the second set of switches includes at least two switches per phase of a second one of the switched reluctance machines.

15. The electric drive system of claim 12, wherein the first bus bar is disposed parallel to the first surface of the heat sink, the second bus bar is disposed parallel to the second surface of the heat sink, and the third bus bar is disposed perpendicular relative to each of the first surface and the second surface of the heat sink.

16. The electric drive system of claim 12, further being scalable and comprising two or more converter circuits enclosed within a housing.

* * * * *